United States Patent
Fan et al.

(10) Patent No.: US 9,704,897 B1
(45) Date of Patent: Jul. 11, 2017

(54) DISPLAY PANEL AND METHOD OF PREPARING THE SAME, DISPLAY DEVICE

(71) Applicants: BOE Technology Group Co., Ltd., Beijing (CN); Beijing BOE Optoelectronics Technology Co., Ltd., Beijing (CN)

(72) Inventors: Yuguang Fan, Beijing (CN); Jingpeng Li, Beijing (CN); Jian Li, Beijing (CN); Yifeng Tan, Beijing (CN); Wei Li, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/231,873

(22) Filed: Aug. 9, 2016

(30) Foreign Application Priority Data

Mar. 25, 2016 (CN) .......................... 2016 1 0179793

(51) Int. Cl.
*H01L 27/12* (2006.01)
*H01L 21/4757* (2006.01)
*H01L 21/47* (2006.01)

(52) U.S. Cl.
CPC .......... *H01L 27/1262* (2013.01); *H01L 21/47* (2013.01); *H01L 21/47573* (2013.01); *H01L 27/124* (2013.01); *H01L 27/1288* (2013.01)

(58) Field of Classification Search
CPC .................................. G04B 31/08; G04D 5/00
See application file for complete search history.

(56) References Cited

U.S. PATENT DOCUMENTS 5,623,354 A * 4/1997 Lien .................. G02F 1/133753
349/124

FOREIGN PATENT DOCUMENTS

CN          1742226 A     3/2006

* cited by examiner

*Primary Examiner* — Roy Potter
*Assistant Examiner* — Paul Patton
(74) *Attorney, Agent, or Firm* — Westman, Champlin & Koehler, P.A.

(57) ABSTRACT

A display panel, a preparing method thereof and a display device are provided. The method of preparing a display panel includes steps of: coating an alignment material on both a display region of an array substrate and an electrode region of the array substrate located around a periphery of the display region; aligning the alignment material; assembling the aligned array substrate and an aligned color filter substrate into an assembly; cutting the assembly of the array substrate and the color filter substrate into a plurality of display panel units, such that the electrode region of the array substrate is not covered by the color filter substrate in each of the display panel units; and removing the alignment material covering the electrode region of the array substrate so as to expose the electrode region.

19 Claims, 3 Drawing Sheets

DISPLAY PANEL AND METHOD OF PREPARING THE SAME, DISPLAY DEVICE

CROSS-REFERENCE TO RELATED APPLICATION

This application claims the benefit of Chinese Patent Application No. 201610179793.7 filed on Mar. 25, 2016 in the State Intellectual Property Office of China, the whole disclosure of which is incorporated herein by reference.

BACKGROUND OF THE INVENTION

Field of the Invention

Embodiments of the present disclosure relate to a field of display technology, in particular, to a method of preparing a display panel, a display panel prepared by the method and a display device.

Description of the Related Art

Currently, a liquid crystal display (LCD) is one of the widely used displays. The liquid crystal display generally comprises an array substrate and a color filter substrate which are assembled into an assembly, and a liquid crystal layer provided between the array substrate and the color filter substrate. The array substrate has a display region in which a plurality of thin film transistors are disposed. The thin film transistors are connected to respective control electrodes, in this way, scanning signals and data signals are introduced by the control electrodes so as to control the deflection of the liquid crystal, thereby allowing or not allowing light to be transmitted and controlling an amount of the transmitted light. A control circuit for introducing the signals to the control electrodes is typically disposed in a non-display region of the array substrate.

Meanwhile, in order to anchor the liquid crystal in an initial angle, alignment layers are provided in the display regions of both the array substrate and the color filter substrate, respectively. An existing method of preparing the alignment layer of the array substrate typically comprises: coating polyimide material on the display region of the array substrate, and then aligning the coated polyimide material with cotton cloth or fiber cloth so as to form an alignment layer. The Applicant has found that there are at least the following problems in the prior art: in order to ensure a region where a control circuit is located is exposed, the polyimide material is typically coated on only the display region of the array substrate, and then the alignment layer is formed through an alignment process. However, due to a limitation of the coating process, some defects occur in the alignment material at an interface between the display region and the non-display region, correspondingly, a surface of the alignment material at the interface is easily damaged during the alignment process, so that a notable rubbing mura may be produced around the interface. The rubbing mura in the alignment layer may cause ripples to be produced in a display image, thereby affect a display effect adversely.

Therefore, a problem to be solved at present is to design a configuration or a method which allows the alignment layer in the display panel to have less rubbing mura or even no rubbing mura so as to improve the display effect.

SUMMARY OF THE INVENTION

According to an aspect of the present disclosure, it is provided a method of preparing a display panel, comprising steps of:

coating an alignment material on both a display region of an array substrate and an electrode region of the array substrate located around a periphery of the display region;

aligning the alignment material;

assembling the aligned array substrate and an aligned color filter substrate into an assembly;

cutting the assembly of the array substrate and the color filter substrate into a plurality of display panel units, such that the electrode region of the array substrate is not covered by the color filter substrate in each of the display panel units; and removing the alignment material covering the electrode region of the array substrate so as to expose the electrode region.

In an embodiment, the step of removing the alignment material covering the electrode region of the array substrate comprises a step of removing the alignment material covering the electrode region through ion etching.

In an embodiment, the ion etching is conducted under a condition defined by the following process parameters: power in a range of 220 to 280 watts, Ar flowing rate in a range of 3 to 13 liters per minute, $O_2$ flowing rate in a range of 0.028 to 0.035 liters per minute and etching duration in a range of 15 to 25 seconds.

In an embodiment, the ion etching is conducted under the condition defined by the following process parameters: power of 220 watts, Ar flowing rate of 7 liters per minute, $O_2$ flowing rate of 0.035 liters per minute and etching duration of 15 seconds.

In an embodiment, the ion etching is conducted under the condition further defined by the following process parameter: a percentage by volume of $O_2$ to a total gas including $O_2$ and Ar in a range of 0.3%-0.7%.

In an embodiment, the step of removing the alignment material covering the electrode region of the array substrate comprises a step of removing the alignment material covering the electrode region through chemical etching.

In an embodiment, the preparing method further comprises: covering the display region of the array substrate by means of sealing adhesive or sucking disk before removing the alignment material covering the electrode region through chemical etching.

In an embodiment, an etching solution used in the chemical etching comprises hydrazine compounds or hydroxide solutions.

In an embodiment, the step of covering the display region of the array substrate by means of sealing adhesive comprises a step of covering the display region of the array substrate with photoresist.

In an embodiment, the photoresist consists of the following components: 75 to 90 percentage by weight propylene glycol monomethyl ether acetate (PGMEA), 5 to 15 percentage by weight phenolic resin and 2 to 10 percentage by weight photo active compound (PAC).

In an embodiment, the step of coating the alignment material on the array substrate comprises: coating the alignment material by means of relief printing, jet printing or screen printing.

In an embodiment, in the step of coating the alignment material on the array substrate, the alignment material comprises polyimide.

In an embodiment, the step of aligning the alignment material comprises: aligning the alignment material by means of rubbing alignment or photo alignment.

According to another aspect of the present disclosure, it is further provided a display panel prepared by the preparing method according to any one of the above embodiments.

In an embodiment, the display panel comprises a color filter substrate and an array substrate having a display region and an electrode region located around a periphery of the display region, and the electrode region of the array substrate is not covered by the color filter substrate.

According to another further aspect of the present disclosure, it is provided a display device comprising the display panel according to any one of the above embodiments.

LIST OF REFERENCE NUMERALS

10: array substrate;
20: alignment material;
30: color filter substrate;
1: display region;
2: electrode region.

DETAILED DESCRIPTION OF PREFERRED EMBODIMENTS OF THE INVENTION

In order to enable those skilled in the art to better understand the technical solutions of the present disclosure, the present disclosure will be further described in detail with reference to accompanying drawings and specific embodiments.

The present disclosure is based on a preparing method mainly comprising: coating an alignment material on both a display region and an electrode region of an array substrate, i.e. in a fully-coating manner, and then removing the alignment material covering the electrode region so as to form a final alignment layer. In this way, rubbing mura on the alignment layer may be substantially reduced.

According to an embodiment of the present disclosure, it is provided a method of preparing a display panel, in which the alignment material coated on the electrode region is removed through ion etching so as to form a final alignment layer and completely expose electrodes in the electrode region.

Figure 1:
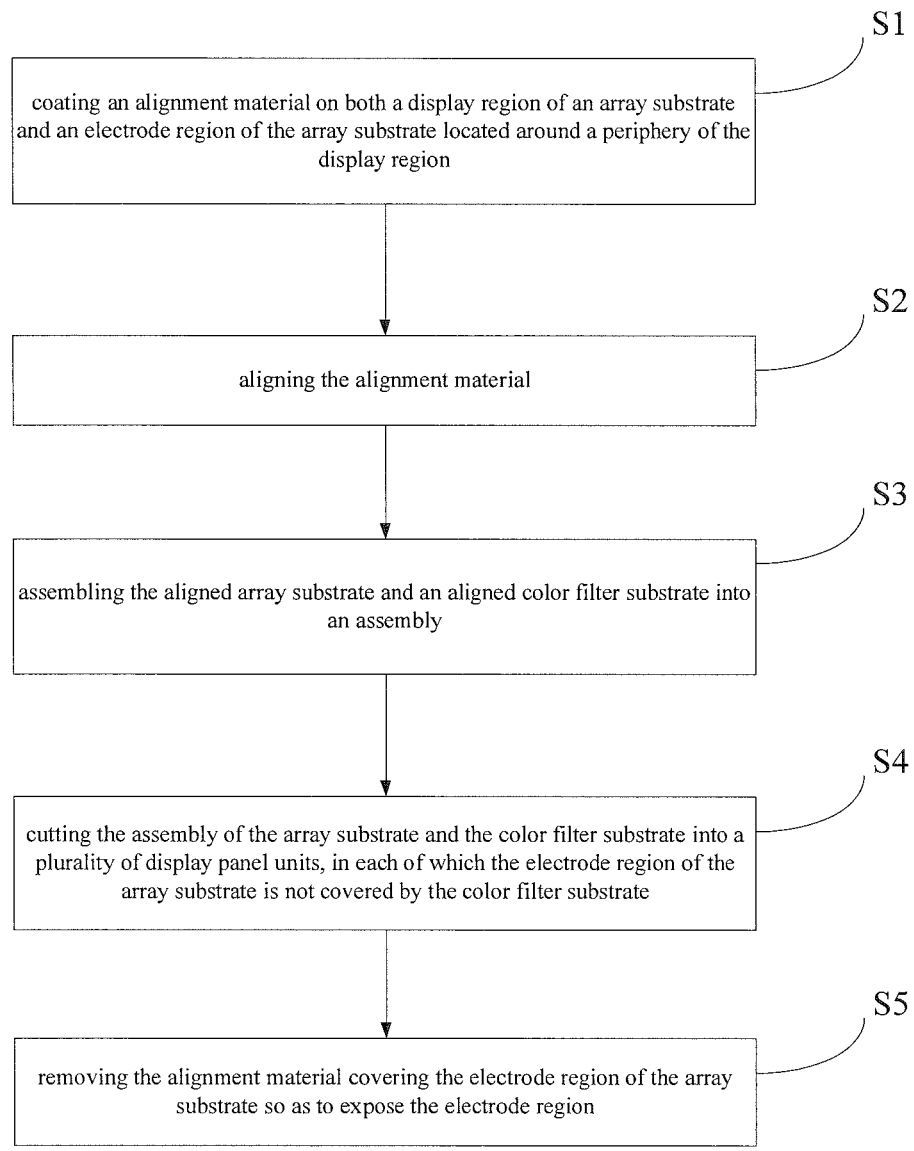
FIG. 1 is a flow chart of a method of preparing a display panel according to an embodiment of the present disclosure.
Figure 3A:
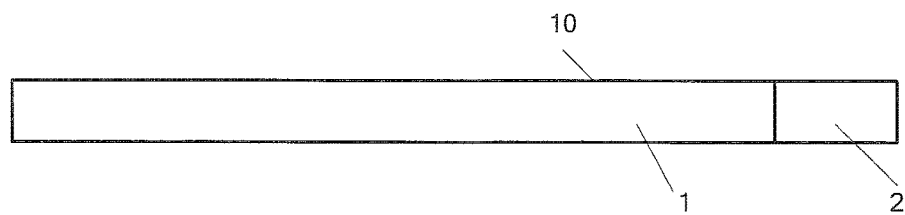
FIGS. 3A-3D schematically show structures formed in various steps of the method of preparing a display panel according to the embodiment of the present disclosure, respectively.
Figure 3B:
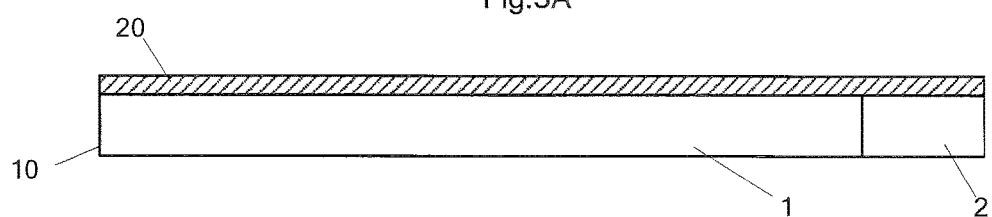
Figure 3C:
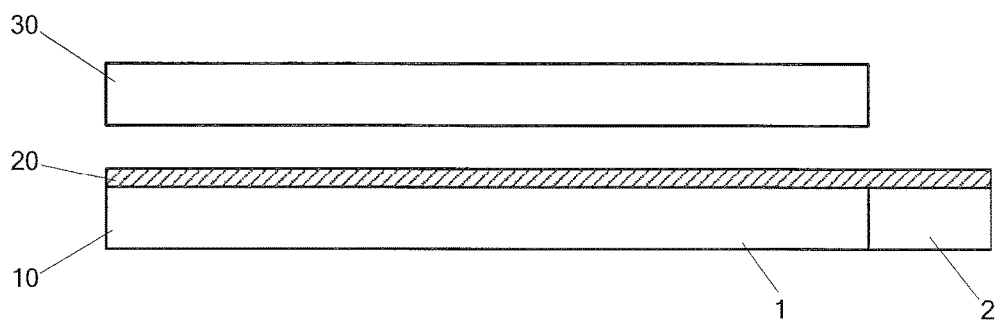
Figure 3D:
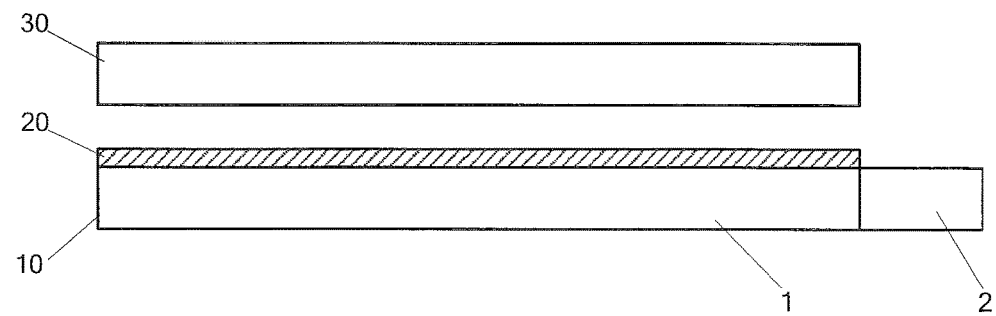

FIG. 1 is a flow chart of a method of preparing a display panel according to an embodiment of the present disclosure, as shown in FIG. 1, the method of preparing a display panel may comprise steps of:

S1. coating an alignment material 20 on both a display region 1 of an array substrate 10 and an electrode region 2 of the array substrate 10 located around a periphery of the display region;

S2. aligning the alignment material;

S3. assembling the aligned array substrate 10 and an aligned color filter substrate 30 into an assembly, as schematically shown in FIG. 3C;

S4. cutting the assembly of the array substrate and the color filter substrate into a plurality of display panel units, such that the electrode region 2 of the array substrate 10 is not covered by the color filter substrate 30 in each of the display panel units, as shown in FIG. 3C;

S5. removing the alignment material 20 covering the electrode region 2 of the array substrate 10 so as to expose the electrode region 2, as shown in FIG. 3D.

It should be understood that the method may also further comprise: coating the alignment material on a color filter substrate in step S1, and further aligning the alignment material on the color filter substrate in step S2, so as to form the aligned color filter substrate.

Figure 2:
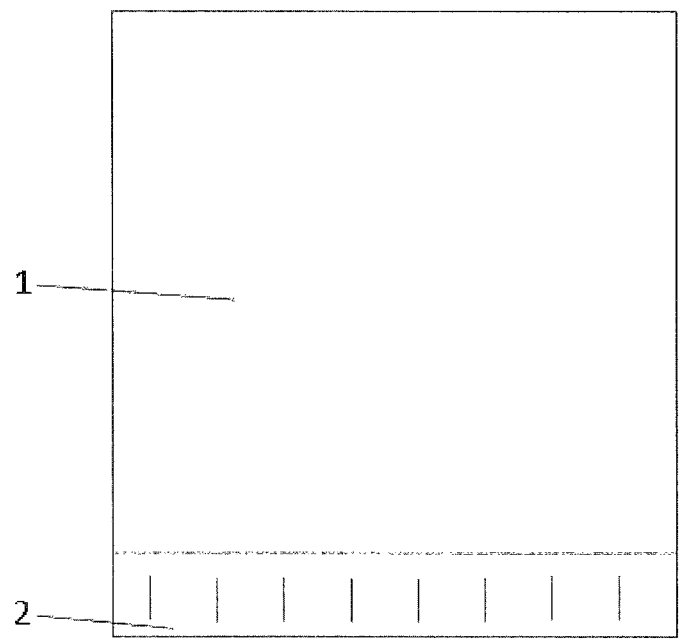
FIG. 2 is a top view of an array substrate on which an alignment material is to be coated according to an embodiment of the present disclosure.

FIG. 2 is a top view of the array substrate on which the alignment material is to be coated, and FIG. 3A is a front view of the array substrate on which the alignment material is to be coated. As shown in FIGS. 2 and 3A, the array substrate 10 on which the alignment material is to be coated comprises a display region 1 and an electrode region 2 located around a periphery of the display region 1. Electrodes are disposed in the electrode region 2. FIG. 3B is a front view of the array substrate on which the alignment material 20 has been coated. As shown in FIG. 3B, the alignment material 20 is coated on both the display region 1 and the electrode region 2 of the array substrate 10.

In step S1, regions where the alignment material is coated comprise the display region 1 and the electrode region 2 of the array substrate. The alignment material preferably comprises polyimide.

The alignment material may be coated by means of relief printing method, jet printing method or screen printing method. The specific printing method may be selected depending on processing environment, moreover, all the above printing methods have a high technical maturity and a good coating effect.

Further, as the alignment material is coated on both the display region 1 and the electrode region 2 of the array substrate in the preparing method according to the embodiment of the present disclosure, compared to the prior art in which the alignment material is coated on only the display region 1 of the array substrate, the preparing method according to the embodiment of the present disclosure is capable of avoiding the coating defect at a periphery of the array substrate, so as to improve the coating quality and eliminate the rubbing mura at its source.

In step S2, the alignment material coated on the array substrate is aligned through rubbing alignment or photo alignment. Preferably, the rubbing alignment may be selected in order to reduce device cost and reduce alignment difficulty.

In step S3, the aligned array substrate and a previously prepared color filter substrate are assembled into an assembly, for example, by means of mature and common assembling manners, and the color filter substrate may be prepared through common processes.

In step S4, the assembly of the array substrate and the color filter substrate (i.e. mother boards) is cut into a plurality of display panel units by means of common cutting manners. In each of the display panel units, the electrode region of the array substrate is not covered by the color filter substrate. In other words, the color filter substrate is just opposite to and has the same area as the display region of the array substrate. Thus, the electrode region of the array substrate neither overlaps with the color filter substrate, nor is blocked by the color filter substrate. In this way, it facilitates removing the alignment material covering the electrode region in a following step.

In step S5, the alignment material covering the electrode region is removed, for example, through ion etching.

With regard to the ion etching, a plurality of tests are conducted in various conditions defined by process parameters comprising: power, $O_2$ content (i.e. a percentage by volume of $O_2$ to a total gas including $O_2$ and Ar), Ar flowing rate, $O_2$ flowing rate and etching duration. In each of the tests, a thickness of residual polyimide (PI) material is measured. The specific test statistics are shown in the following table:

| Parameter Segments | | power (W) | Ar flowing rate (LPM) | $O_2$ flowing rate (LPM) | Etching duration (Sec) | residual PI thickness (Å) |
|---|---|---|---|---|---|---|
| Power 180W | $O_2$ content 0.3% | 180 | 7 | 0.02 | 40 | 697 |
| Power 200W | | 200 | 7 | 0.02 | 20 | 601 |
| | | 200 | 7 | 0.02 | 25 | 385 |
| | | 200 | 7 | 0.02 | 30 | 361 |
| Power 220W | | 220 | 7 | 0.02 | 20 | 432 |
| | | 220 | 7 | 0.02 | 25 | 216 |
| | $O_2$ content 0.4% | 220 | 7 | 0.028 | 15 | 456 |
| | | 220 | 7 | 0.028 | 20 | 0 |
| | | 220 | 7 | 0.028 | 25 | 0 |
| | $O_2$ content 0.5% | 220 | 7 | 0.035 | 15 | 0 |
| | | 220 | 7 | 0.035 | 20 | 0 |
| | $O_2$ content 0.6% | 220 | 7 | 0.042 | 10 | 409 |
| | | 220 | 7 | 0.042 | 15 | 0 |
| | | 220 | 7 | 0.042 | 20 | 0 |
| Power 220-280W | $O_2$ content 0.5% | 240 | 7 | 0.035 | 15 | 0 |
| | | 260 | 7 | 0.035 | 10 | 384 |
| | | 260 | 7 | 0.035 | 15 | 144 |
| | $O_2$ content 0.6% | 280 | 7 | 0.035 | 10 | 264 |
| | $O_2$ content 0.7% | 280 | 7 | 0.035 | 15 | 0 |

It can be seen from the above table that, if the process parameters of the ion etching are set within certain ranges, respectively, the alignment material covering the electrode region may be thoroughly removed so as to form a final alignment layer and completely expose the electrodes in the electrode region, that is, to make the thickness of residual polyimide material to be 0 Å. Preferably, the respective ranges of the process parameters may include: power: 220 to 280 W (Watts); Ar flowing rate: 3 to 13 Lpm(liter per minute); $O_2$ flowing rate: 0.028 to 0.035 Lpm; and etching duration: 15 to 25 Sec (Second).

Due to alignment efficiency and manufacturing cost, the process parameters which allow less power and less etching duration may be preferably selected. More preferably, according to the above table, the ion etching may be conducted in the condition defined by the following process parameters: power of 220 W, Ar flowing rate of 7 Lpm, $O_2$ flowing rate of 0.035 Lpm and etching duration of 15 Sec.

Additionally, the process parameters of the ion etching may further include: a percentage by volume of $O_2$ to a total gas including $O_2$ and Ar by volume: 0.3% to 0.7%.

In this way, it is not only ensured that the polyimide material covering the electrode region can be thoroughly removed, but also the selected power (220 W) and the required etching duration (15 Sec) are least, thereby substantially reducing power consumption, saving manufacturing time and increasing economic performance.

The preparing method according to the embodiment of the present disclosure allows the alignment layer formed finally in the display panel to have less rubbing mura or even no rubbing mura, so as to improve the display effect. The preparing method is not strict with a shape of the interface of the alignment layer between the display region and the non-display region, as long as it is ensured that the electrode region is exposed to facilitate being tested and welded. By using the above preparing method, an advantageous alignment layer is obtained while it is effectively ensured that the electrode region is exposed to facilitate being tested and welded, further, a good display effect is ensured.

Correspondingly, an embodiment of the present disclosure further provides a display panel which is prepared by using the preparing method according to the above embodiment of the present disclosure, and the electrode region of the display panel is not covered by the color filter substrate.

Another embodiment of the present disclosure further provides a display device comprising the above display panel.

In the display panel, the preparing method thereof and the display device according to the above embodiments of the present disclosure, firstly, the alignment material is coated on both the display region and the electrode region of the array substrate, i.e. in a fully-coating manner, secondly, the alignment material covering the electrode region is thoroughly removed through ion etching so as to form the final alignment layer and completely expose the electrodes in the electrode region, so that the electrodes are suitable to be used in following electrode testing and welding operations, finally, other assembling operations for the display panel are completed. In this way, rubbing mura on the alignment layer may be substantially reduced so that ripple defect in display image may be reduced, thereby improving the display effect of the display panel.

Another embodiment of the present disclosure further provides a method of preparing a display panel. This preparing method is similar to the above preparing method and differs from it only in that: in this preparing method, the alignment material coating the electrode region is removed through chemical etching so as to form the final alignment layer and completely expose the electrodes in the electrode region.

Specifically, the step of removing the alignment material covering the electrode region of the array substrate comprises a step of removing the alignment material covering the electrode region through chemical etching.

In particular, the preparing method further comprises: covering the display region of the array substrate by means of sealing adhesive or sucking disk before removing the alignment material covering the electrode region through chemical etching. This is because a strong alkaline solution for etching the alignment material is used to etch the alignment material only on the electrode region, rather than on the display region. Therefore, the display region is protected by means of sealing adhesive or sucking disk, so as to avoid the alignment material on the display region from being etched by the strong alkaline solution while ensure a thickness and smoothness of the display region of the array substrate.

In the above sealing adhesive manner, similar to a wet etching in an array process, for example, photoresist (PR) may be used to cover the entire display region so as to protect the display region from being etched by a solution used in the chemical etching. For example, the photoresist may consist of the following components: 75 to 90 percentage by weight (wt. %) propylene glycol monomethyl ether acetate (PGMEA), 5 to 15 percentage by weight phenolic resin and 2 to 10 percentage by weight photo active compound (PAC). In the above sucking disk manner, a physical sucking manner may be used to protect the entire display region.

The etching solution used in the chemical etching here may comprise a strong alkaline solution which has a PH value equal to or greater than 13. The strong alkaline solution may comprise hydrazine compounds or hydroxide solutions, such as NaOH, KOH, so as to increase etching efficiency.

Other steps of the method of preparing a display panel according to this embodiment of the present disclosure are similar to that of the previous embodiments, and they are omitted here.

A further embodiment of the present disclosure further provides a display panel which is prepared by using the preparing method according to the embodiment of the present disclosure. The electrode region of the display panel is not covered by the color filter substrate. In particular, the display panel comprises the array substrate comprising the display region and the electrode region located around the periphery of the display region, and the color filter substrate, and the electrode region of the array substrate is not covered by the color filter substrate.

Another embodiment of the present disclosure further provides a display device comprising the above display panel.

In the display panel, the preparing method thereof and the display device according to the above embodiments of the present disclosure, the alignment material covering the electrode region is thoroughly removed through chemical etching so as to form the final alignment layer and expose the electrodes in the electrode region completely. In this way, rubbing mura on the alignment layer may also be substantially reduced, thereby improving the display effect of the display panel.

It can be understood that the above embodiments are only some exemplary embodiments used to explain the principle of the present invention, however, the present invention is not limited thereto. Various modifications and changes may be made by those skilled in the art without departing from the spirit and essence of the present invention. These modifications and changes may also be considered as the scope of the present invention.

What is claimed is:

1. A method of preparing a display panel, comprising steps of:
   coating an alignment material on both a display region of an array substrate and an electrode region of the array substrate located around a periphery of the display region;
   aligning the alignment material;
   assembling the aligned array substrate and an aligned color filter substrate into an assembly;
   cutting the assembly of the array substrate and the color filter substrate into a plurality of display panel units, such that the electrode region of the array substrate is not covered by the color filter substrate in each of the display panel units; and
   removing the alignment material covering the electrode region of the array substrate so as to expose the electrode region.

2. The method according to claim 1, wherein the step of removing the alignment material covering the electrode region of the array substrate comprises a step of removing the alignment material covering the electrode region through ion etching.

3. The method according to claim 2, wherein the ion etching is conducted under a condition defined by the following process parameters: power in a range of 220 to 280 watts, Ar flowing rate in a range of 3 to 13 liters per minute, $O_2$ flowing rate in a range of 0.028 to 0.035 liters per minute and etching duration in a range of 15 to 25 seconds.

4. The method according to claim 3, wherein the ion etching is conducted under the condition defined by the following process parameters: power of 220 watts, Ar flowing rate of 7 liters per minute, $O_2$ flowing rate of 0.035 liters per minute and etching duration of 15 seconds.

5. The method according to claim 3, wherein the ion etching is conducted under the condition further defined by the following process parameter: a percentage by volume of $O_2$ to a total gas including $O_2$ and Ar in a range of 0.3%-0.7%.

6. The method according to claim 1, wherein the step of removing the alignment material covering the electrode region of the array substrate comprises a step of removing the alignment material covering the electrode region through chemical etching.

7. The method according to claim 6, further comprising: covering the display region of the array substrate by means of sealing adhesive or sucking disk before removing the alignment material covering the electrode region through chemical etching.

8. The method according to claim 6, wherein an etching solution used in the chemical etching comprises hydrazine compounds or hydroxide solutions.

9. The method according to claim 7, wherein the step of covering the display region of the array substrate by means of sealing adhesive comprises a step of covering the display region of the array substrate with photoresist.

10. The method according to claim 9, wherein the photoresist consists of the following components: 75 to 90 percentage by weight propylene glycol monomethyl ether acetate (PGMEA), 5 to 15 percentage by weight phenolic resin and 2 to 10 percentage by weight photo active compound (PAC).

11. The method according to claim 1, wherein the step of coating the alignment material on the array substrate comprises: coating the alignment material by means of relief printing, jet printing or screen printing.

12. The method according to claim 2, wherein the step of coating the alignment material on the array substrate comprises: coating the alignment material by means of relief printing, jet printing or screen printing.

13. The method according to claim 6, wherein the step of coating the alignment material on the array substrate comprises: coating the alignment material by means of relief printing, jet printing or screen printing.

14. The method according to claim 1, wherein, in the step of coating the alignment material on the array substrate, the alignment material comprises polyimide.

15. The method according to claim 1, wherein the step of aligning the alignment material comprises: aligning the alignment material through rubbing alignment or photo alignment.

16. The method according to claim 2, wherein the step of aligning the alignment material comprises: aligning the alignment material through rubbing alignment or photo alignment.

17. The method according to claim 6, wherein the step of aligning the alignment material comprises: aligning the alignment material through rubbing alignment or photo alignment.

18. A display panel prepared by the method according to claim 1,
   wherein the display panel comprises a color filter substrate and an array substrate having a display region and an electrode region located around a periphery of the display region, and the electrode region of the array substrate is not covered by the color filter substrate.

19. A display device comprising the display panel according to claim 18.

* * * * *